United States Patent
Korenaga

(10) Patent No.: US 7,280,185 B2
(45) Date of Patent: Oct. 9, 2007

(54) STAGE SYSTEM INCLUDING FINE-MOTION CABLE UNIT, EXPOSURE APPARATUS, AND METHOD OF MANUFACTURING DEVICE

(75) Inventor: Nobushige Korenaga, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/407,152

(22) Filed: Apr. 20, 2006

(65) Prior Publication Data

US 2006/0187439 A1    Aug. 24, 2006

Related U.S. Application Data

(62) Division of application No. 10/893,932, filed on Jul. 20, 2004, now Pat. No. 7,057,710.

(30) Foreign Application Priority Data

Jul. 31, 2003   (JP)   ............... 2003-204674

(51) Int. Cl.
  *G03B 27/58*   (2006.01)
  *G03B 27/62*   (2006.01)
(52) U.S. Cl. ......................... 355/72; 355/75
(58) Field of Classification Search .......... 355/72, 355/75, 77, 53; 700/60, 121

See application file for complete search history.

(56) References Cited

U.S. PATENT DOCUMENTS

| 4,723,086 | A  | 2/1988 | Leibovich et al. ........... 310/328 |
| 6,570,645 | B2 | 5/2003 | Korenaga et al. ............. 355/75 |
| 6,693,402 | B2 | 2/2004 | Ebihara et al. ............. 318/649 |
| 6,740,891 | B2 | 5/2004 | Driessen et al. .......... 250/492.1 |
| 6,879,377 | B2 | 4/2005 | Jacobs et al. ................. 355/53 |
| 6,937,911 | B2 | 8/2005 | Watson ........................ 700/60 |
| 2003/0098966 | A1 | 5/2003 | Korenaga et al. ............. 355/75 |

FOREIGN PATENT DOCUMENTS

| JP | 2000-106344 | 4/2000 |
| JP | 2002-43213  | 2/2002 |

*Primary Examiner*—Rodney Fuller
(74) *Attorney, Agent, or Firm*—Fitzpatrick, Cella, Harper & Scinto

(57) ABSTRACT

A stage system that reduces disturbances caused by deformation of a cable and achieves high-precision positioning. The stage system includes a substrate stage movable in at least two axial directions, a fine-motion cable unit that holds a cable and finely moves in at least two axial directions, and a coarse-motion cable unit that coarsely moves the fine-motion cable unit in at least one axial direction.

5 Claims, 8 Drawing Sheets

STAGE SYSTEM INCLUDING FINE-MOTION CABLE UNIT, EXPOSURE APPARATUS, AND METHOD OF MANUFACTURING DEVICE

This application is a divisional application of copending U.S. patent application Ser. No. 10/893,932, filed Jul. 20, 2004, now U.S. Pat. No. 7,057,710.

This application claims priority from Japanese Patent Application No. 2003-204674 filed Jul. 31, 2003, which is hereby incorporated by reference.

BACKGROUND OF THE INVENTION

1. Field of the Invention

The present invention relates to stage systems, and preferably, to a stage system installed in an exposure apparatus for manufacturing a semiconductor device.

2. Description of the Related Art

An exposure apparatus used during the manufacture of a device, such as a semiconductor device, or a liquid crystal device, has a stage system for moving a master plate, such as a mask, a reticle, or a substrate subjected to exposure, such as a semiconductor wafer, or a glass substrate (hereinafter, they are collectively called a substrate).

Such a stage system is disclosed in, for example, Japanese Patent Laid-Open No. 2000-106344A (See FIG. 11). Referring to FIG. 11, a yaw guide 550 and a Y stage 551 are disposed on a base table 502. The yaw guide 550 and the base table 502 guide the Y stage 551. Airsliders (not shown) are disposed between the Y stage 551 and the base table 502 and between the Y stage 551 and the yaw guide 550 so that the Y stage 551 is slidable in the Y direction.

An X stage 561 encloses the Y stage 551. The X stage 561 is guided by sides of the Y stage 551. An airslider is disposed between the sides of the Y stage 551 and the X stage 561. Also, an airslider (not shown) is disposed between the X stage 561 and the base table 502. As a result, the X stage 561 is slidable in the X direction on the Y stage 551. Since the Y stage 551 is slidable in the Y direction and the X stage 561 is slidable in the X direction on the Y stage 551, as mentioned above, the X stage 561, being a coarse-motion stage, is slidable in the X and Y directions on the base table 502.

A fine-motion stage, comprising a six-axis fine-motion linear motor and a wafer top plate 501, is disposed on the X stage 561. A wafer chuck (not shown) is disposed on the wafer top plate 501 so as to expose a wafer (not shown) on the wafer chuck to form a pattern of a mask on the wafer. The positions of the fine-motion stage and the coarse-motion stage are measured and controlled independently of each other.

In order to reduce adverse effects of a cable for supplying power to a stage on the stage in a stage system, Japanese Patent Laid-Open No. 2002-043213A discloses a power-supplying stage (cable-holding stage), which holds a power-supplying cable, so as to be synchronized to movement of an X-Y stage.

SUMMARY OF THE INVENTION

In an arrangement in which a cable connected to a fine-motion stage is routed to, for example, a cable-holding stage movable in a long stroke, as shown in Japanese Patent Laid-Open No. 2002-043213A, when relative positions of the fine-motion stage and the coarse-motion stage vary during positioning due to decreased positioning accuracy of the coarse-motion stage, the cable between the fine-motion stage and the coarse-motion stage becomes deformed. This causes disturbances to the fine-motion stage, thus decreasing positioning accuracy of the fine-motion stage.

Moreover, for controlling the position of the cable-holding stage or the coarse-motion X-Y stages by means of the airslider (mentioned above), with great accuracy, it is difficult to realize a stage movable in a long stroke in terms of machining ability.

In view of the foregoing, it is an object of the present invention to provide a stage system capable of performing high-precision positioning by reducing effects of disturbances caused by a cable, such as a power cable, a sensor cable, a vacuum cable, or the like.

To solve the above problems, according to an aspect of the present invention, a stage system includes: a substrate stage movable in at least two axial directions; a fine-motion cable unit that holds a cable connected to the substrate stage and is movable in a short stroke in at least two axial directions; and a coarse-motion cable unit for moving the fine-motion cable unit in a long stroke in at least one axial direction. Therefore, disturbances resulting from the cable are reduced, thus achieving high-precision positioning of the stage system.

Preferably, the fine-motion cable unit may follow the substrate stage. Therefore, disturbances resulting from the cable to the substrate stage are reduced simultaneously. As a result, the positioning of the fine-motion stage with higher accuracy is achieved.

Preferably, the stage system may further include a coarse-motion stage on which the substrate stage is disposed. The coarse-motion stage may be movable in a long stroke in at least one axial direction, and the coarse-motion stage and the coarse-motion cable unit may be integrated together. As a result, there is no need to have an additional mechanism to enable the fine-motion cable unit and the substrate stage to follow the long-stroke movement. Therefore, errors occurring when the fine-motion cable unit and the substrate stage follow the coarse movement are reduced and thus, the system can be simplified. Moreover, the number of objects to be controlled is decreased, thus reducing the computation load and achieving high-precision positioning of the substrate stage.

Preferably, the cable may be fixed to the coarse-motion cable unit with the fine-motion cable unit therebetween. As a result, the routing distance of the cable is shortened. Moreover, fixing the cable to the coarse-motion cable unit (coarse-motion stage) with the fine-motion cable unit therebetween, when the coarse-motion stage and the coarse-motion cable unit are integrated together, allows reduced disturbances caused by variations of relative positions of the coarse-motion stage and the substrate stage disposed on the coarse-motion stage, thus achieving high-precision positioning of the substrate stage.

Preferably, the fine-motion cable unit may be supported with respect to the coarse-motion cable unit in a noncontact manner. Therefore, disturbances resulting from the cable can be absorbed by the fine-motion cable unit. Effects caused by the disturbances on the substrate stage are reduced, thus achieving high-precision positioning of the substrate stage.

Preferably, in a non-atmospheric environment, the stage system may have an exhaust slot arranged around a static pressure bearing. As a result, high-precision positioning of the substrate stage is achieved without reducing the concentration of gas in a gas environment or without increasing the pressure in a vacuum.

The substrate stage may be movable in three axial directions, and the fine-motion cable unit may follow the substrate stage in the three axial directions. The substrate stage may be movable in six axial directions, and the fine-motion cable unit may follow the substrate stage in the six axial directions.

The coarse-motion cable unit and/or the coarse-motion stage may be guided by a contact guide. As a result, inexpensive, high-precision positioning can be achieved. The contact guide requires fewer limitations in machining ability than an airslider, so that a stage system movable in a longer stroke is achieved.

Further objects, features and advantages of the present invention will become apparent from the following description of the preferred embodiments (with reference to the attached drawings).

DESCRIPTION OF THE PREFERRED EMBODIMENTS

First Embodiment

Figure 1:
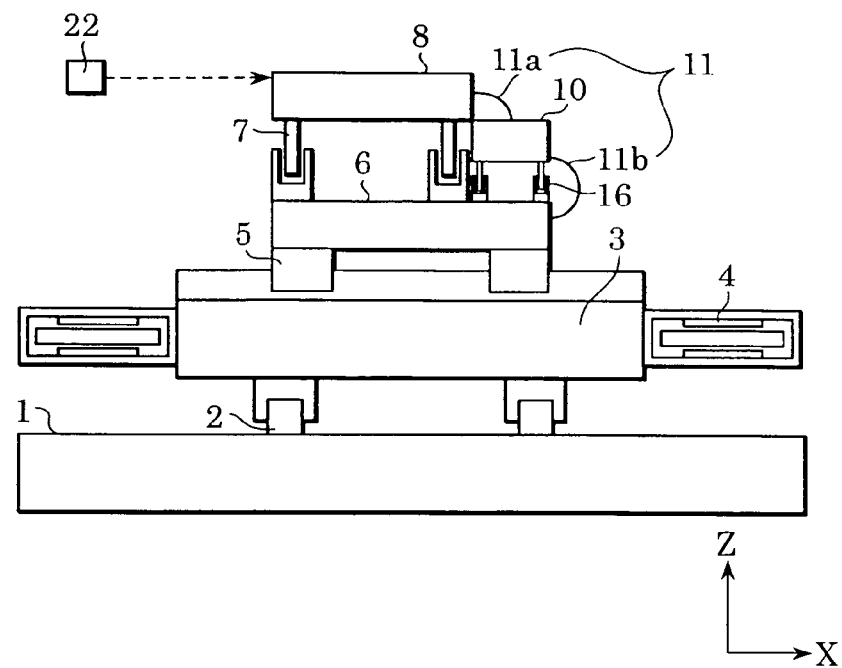
FIG. 1 shows a stage system including a fine-motion cable unit according to a first embodiment of the present invention.

FIG. 1 shows a stage system according to a first embodiment of the present invention. In FIG. 1, a Y stage 3, being a coarse-motion stage in the Y direction, is guided by linear motor (hereinafter referred to as LM) guides 2 fixed on a base table 1 so as to be slidably supported in the Y direction. Y linear motors 4 are disposed on both sides of the Y stage 3 so that the Y stage 3 moves in a long stroke (coarse motion) in the Y direction.

LM guides 5 are disposed on the Y stage 3 to guide an X stage 6, being a coarse-motion stage in the X direction. Therefore, the X stage 6 is slidably supported by the LM guides 5 in the X direction with respect to the Y stage 3. The X stage 6 is equipped with an X linear motor (not shown) so as to be movable in a long stroke in the X direction.

In this embodiment, the LM guides 5 for the X stage 6 and the LM guides 2 for the Y stage 3 are of the LM guide type (e.g., rolling guides), which is inexpensive, has high stiffness, and is of a contact type. However, guides therefore may be airsliders. The X stage 6 and Y stage 3 have sensors (not shown) to measure at least a position of the Y stage 3 in the Y direction and a position of the X stage 6 in the X direction.

A fine-motion stage 8, being a substrate stage, is disposed on the X stage 6, and the position of the fine-motion stage 8 is controlled with respect to the X stage 6 with high accuracy. Since the fine-motion stage 8 may be a known stage as, for example, described in Japanese Patent Laid-Open No. 2000-106344A, a detailed explanation is omitted, except to say that the fine-motion stage 8 is movable in a short stroke (fine motion) in six axial directions consisting of X, Y, Z, $\omega_X$ (rotational direction about the X axis), $\omega_Y$ (rotational direction about the Y axis), and θ (rotational direction about the Z axis) directions. The position of the fine-motion stage 8 in the six axial directions can be measured by an interferometer 22. In other words, the position of the fine-motion stage 8 in the six axial directions can be measured independently of the position of the X-Y stages (i.e., the X stage 6 and Y stage 3), being coarse-motion stages.

A fine-motion cable unit 10, being a fine-motion cable stage that holds a cable 11 (denoted as cables 11a and 11b) and finely moves to absorb deformation of the cable 11 is disposed on the X stage 6. The cable 11, such as a power cable, a sensor cable, a vacuum cable (vacuum pipe), or the like, is connected from the X stage 6, being a coarse-motion stage, to the fine-motion stage 8, with the fine-motion cable unit 10 therebetween, but not directly.

Figure 2:
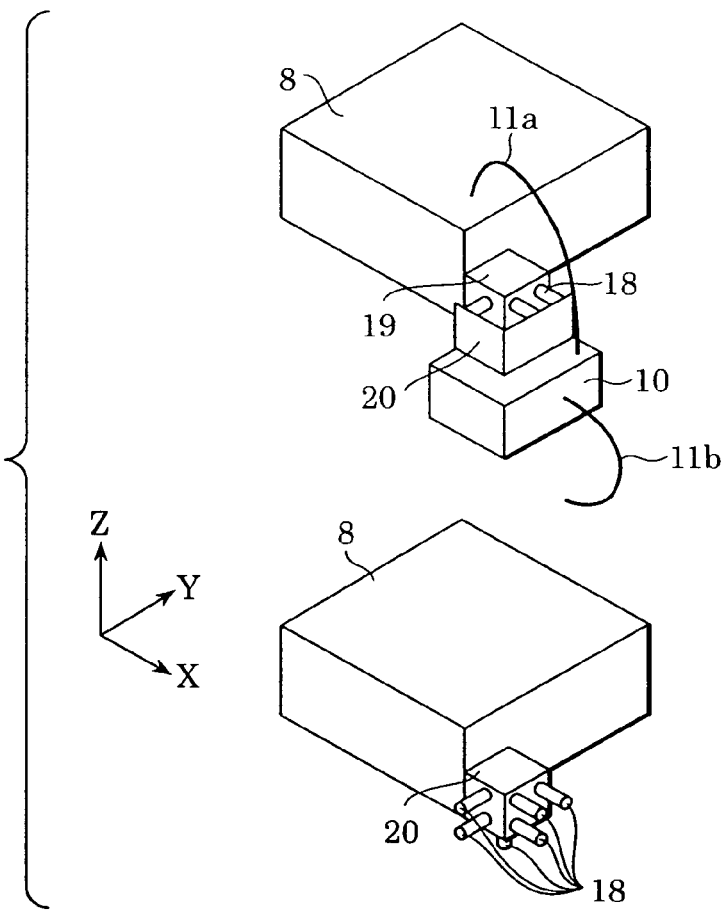
FIG. 2 shows a method of measuring relative positions in the first embodiment.

The fine-motion cable unit 10 has the same structure as that of the fine-motion stage 8 and has fine-motion linear motors that enable the fine-motion cable unit 10 to control its movement in a short stroke in the six axial directions, in a noncontact manner. The relative positions of the fine-motion cable unit 10 and the fine-motion stage 8 in the six axial directions are measured by, for example, gap sensors 18 (as shown in FIG. 2), and therefore, the fine-motion cable unit 10 is controlled so as to follow the fine-motion stage 8 in the six axial directions. As a result, disturbances in the Z, $\omega_X$, and $\omega_Y$ directions are not transmitted to the fine-motion stage 8.

The means for measuring the relative positions of the fine-motion stage 8 and the fine-motion cable unit 10 in the six axial directions will now be described. A rectangular parallelepiped measuring target 19 is disposed on an end of the fine-motion stage 8. The six gap sensors 18, which function as relative-position measuring instruments, consisting of three sensors in the X direction, two sensors in the Y direction, and one sensor in the Z direction, face the three surfaces orthogonal with each other of the measuring target 19. The gap sensors 18 are out of contact with the measuring target 19. The six gap sensors 18 are fixed to the fine-motion cable unit 10 with a gap sensor mounting plate 20.

Therefore, the relative positions of the fine-motion cable unit 10 and the fine-motion stage 8 in the six axial directions can be measured. One end of the cable 11 is fixed on the X stage 6. A cable segment 11b of the cable 11 extends from the X stage 6 to the fine-motion cable unit 10, and a cable segment 11a of the cable 11 extends from the fine-motion cable unit 10 to the fine-motion stage 8.

Figure 3A:
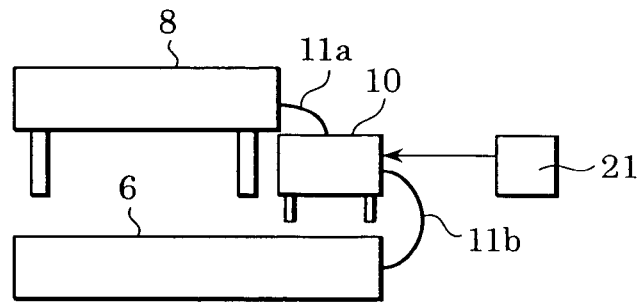
FIGS. 3A and 3B show when the fine-motion cable unit follows a fine-motion stage in the first embodiment.
Figure 3B:
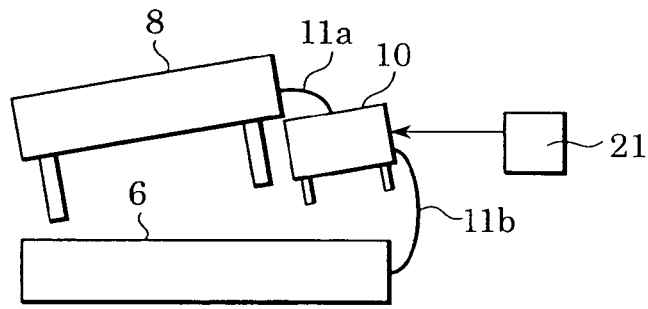

FIGS. 3A and 3B show in part operations of this embodiment. The fine-motion stage 8 is controlled on the basis of instructions provided independently of the positions of the fine-motion cable unit 10 and the X stage 6. By contrast, the fine-motion cable unit 10 is controlled by a controller 21 so as to follow the position of the fine-motion stage 8. FIG. 3B shows a condition when the fine-motion stage 8 is rotated around an axis orthogonal to the plane of FIG. 3B, on the basis of the instructions. Since outputs from the gap sensors 18 (not shown in FIGS. 3A and 3B but shown in FIG. 2) are kept constant, the fine-motion cable unit 10 is moved to the position shown in FIG. 3B.

As a result, compared to the arrangement shown in FIG. 3A, in the arrangement shown in FIG. 3B, a condition of the cable segment 11a remains unchanged and the cable segment 11b is deformed. A produced force involved in the deformation of the cable segment 11b is entirely received by the fine-motion cable unit 10, and therefore, the force is not applied on the cable segment 11a and the fine-motion stage 8.

In the stage system described above, in order to perform high-precision positioning on a wafer being a substrate placed on the fine-motion stage 8, the positions of the coarse-motion stages (i.e., the X stage 6 and Y stage 3) and the fine-motion stage 8 are measured and controlled independently of each other. The fine-motion cable unit 10 is controlled by the gap sensors 18 (see FIG. 2) so as to follow or be synchronized with (hereinafter, this is collectively called "follow", including being substantially synchronized to) the fine-motion stage 8 in the six axial directions.

In this way, the relative positions of the fine-motion stage 8 and the fine-motion cable unit 10 are kept substantially constant. Therefore, even when the relative positions of the coarse-motion stages (i.e., the X stage 6 and Y stage 3) and the fine-motion stage 8 are changed during positioning, disturbances caused by the deformation of the cable 11 are accommodated by the fine-motion cable unit 10 and are not transmitted to the fine-motion stage 8.

As discussed above, the cable 11 is connected to the fine-motion stage 8 through the Y stage 3, the X stage 6, and the fine-motion cable unit 10. One end of the cable segment 11b of the cable 11 is fixed to the X stage 6 and the other end thereof is fixed to the fine-motion cable unit 10. One end of the cable segment 11a of the cable 11 is fixed to the fine-motion cable unit 10 and the other end thereof is fixed to the fine-motion stage 8. The term "fix" herein includes not only when a cable is directly mounted but also when a cable is mounted with an intermediate member.

In this embodiment, measuring the relative positions of the fine-motion stage 8 and the fine-motion cable unit 10 with the gap sensors 18 allows the fine-motion cable unit 10 to follow the fine-motion stage 8. However, measuring absolute positions of the fine-motion stage 8 and the fine-motion cable unit 10 with an interferometer, or the like, may be used as long as the fine-motion cable unit 10 can follow the fine-motion stage 8 while keeping the relative positions thereof substantially constant.

In this embodiment, the fine-motion stage 8 (substrate stage) and the fine-motion cable unit 10 are disposed on the coarse-motion stage (X stage 6) so that the fine-motion stage 8 and the fine-motion cable unit 10 move in unison in a large stroke in response to the movement of the coarse-motion stage (X stage 6). Therefore, there is no need to have an additional coarse-motion cable stage, and the number of objects to be controlled is reduced, thus decreasing the computation load.

The arrangement in which the fine-motion stage 8 and the fine-motion cable unit 10 move in unison in a large stroke may be realized by other methods. In this embodiment, moving the fine-motion stage 8 and the fine-motion cable unit 10 in unison in a large stroke is equal to moving both in unison in a large stroke, while keeping a predetermined positional relationship thereof. The fine-motion cable unit 10 may be disposed on another following stage being a coarse-motion cable stage that is synchronized with or follows a movement of the X stage 6, being the coarse-motion stage, to keep a predetermined positional relationship between the fine-motion stage 8 and the fine-motion cable unit 10 about the coarse motion. In this case, the number of objects to be controlled is increased.

In other words, this embodiment is essentially equal to an arrangement in which the fine-motion cable unit 10 is disposed on another following stage, which is different from the X stage 6, so as to control synchronization between the fine-motion stage 8 and the fine-motion cable unit 10 or to control following of the fine-motion stage 8 by the fine-motion cable unit 10 about the coarse motion.

An embodiment in which the fine-motion cable unit 10 is disposed on another stage, different from the substrate stage, will be described later as a fourth embodiment.

Second Embodiment

Figure 4:
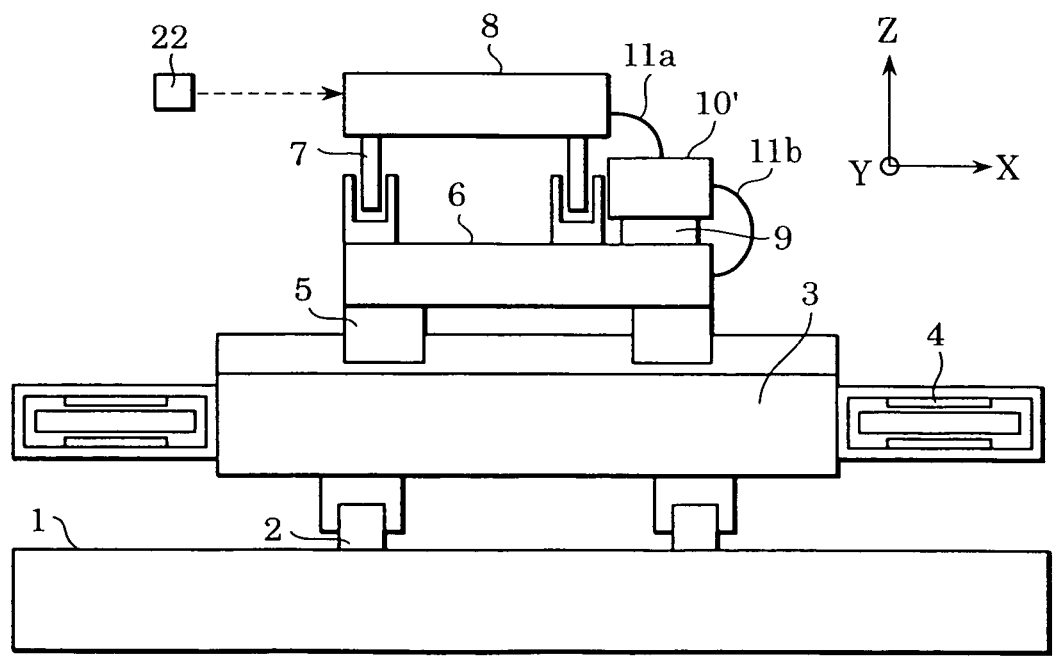
FIG. 4 shows a stage system according to a second embodiment.

FIG. 4 shows an embodiment in which the fine-motion cable unit 10 of the first embodiment is made movable, finely, in three axial directions. The same reference numerals have been retained for similar parts, which have the same structures as those of the first embodiment, and explanations thereof are omitted.

Figure 5A:
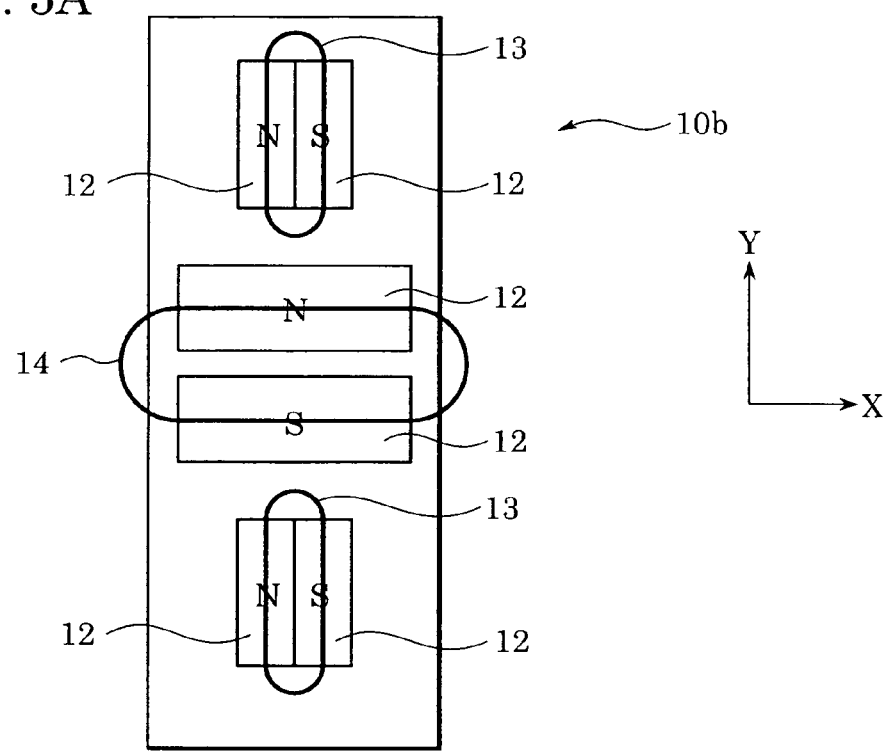
FIGS. 5A to 5C show a fine-motion cable unit of the second embodiment.
Figure 5B:
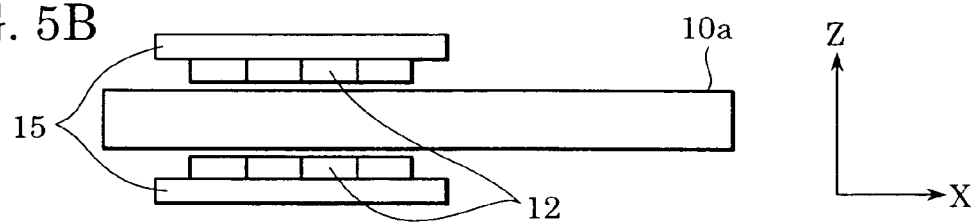
Figure 5C:
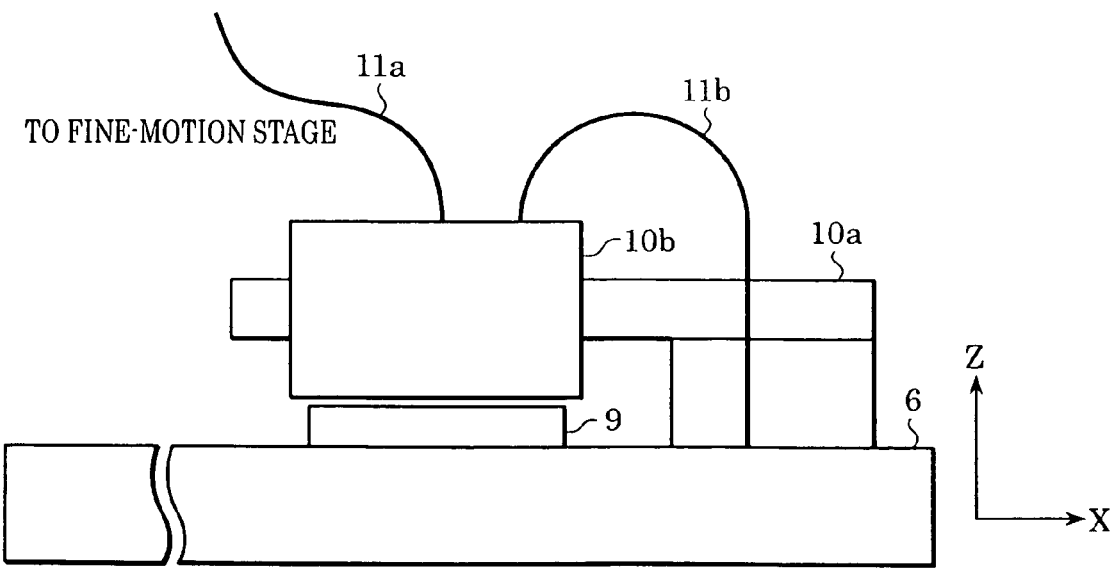

FIGS. 5A to 5C show details of a fine-motion cable unit 10', which is shown in FIG. 4. A magnet unit 10b is supported directly above the X stage 6 so as to be slidable in the X, Y, and θ directions. As illustrated in FIG. 5A, the magnet unit 10b, which is a fine-motion cable unit or a fine-motion cable stage, consists of yokes 13/14 and three pairs of magnets 12 that are magnetized in the Z direction and are fixed to the yokes 15. As shown in FIG. 5B, a coil plate 10a, which will be described below, is sandwiched between the magnets 12 in the vertical (Z) direction.

As shown in FIG. 5A, each pair of the magnets 12 consists of one magnet component in which the north pole faces the coil plate 10a and the other magnet component in which the south pole faces the coil plate 10a. One pair of the magnets 12 is placed in the substantial center and its north and south poles are positioned along the Y direction. The other two pairs are placed on both sides of the central magnet pair in the Y direction and their north and south poles are positioned along the X direction.

The coil plate 10a is used for supporting and fixing two X coils 13 and a Y coil 14, all of which have oblong or elliptical shapes and are placed in the coil plate 10a. The Y coil 14 is situated in a location corresponding to the central pair of magnets 12, and straight-line segments of the Y coil 14 and the Y direction form a substantially right angle. The two X coils 13 are situated in locations corresponding to the other pairs of magnets 12 disposed on both sides of the central pair of magnets 12, and straight-line segments of the X coils 13 and the X direction form a substantially right angle.

The coil plate 10a is fixed on the X stage 6, as shown in FIG. 5C. Controlling the current passing through the three coils, 13 and 14, provides the magnet unit 10b of the fine-motion cable unit 10' with thrust in at least two directions, X and Y, and additionally, yields rotational force in the θ direction.

The cable 11 (by segments 11a and 11b) is connected to the fine-motion stage 8 through the Y stage 3, the X stage 6, and the magnet unit 10b of the fine-motion cable unit 10'. One end of the cable segment 11b of the cable 11 is fixed to the X stage 6 and the other end thereof is fixed to the magnet unit 10b. One end of the cable segment 11a of the cable 11 is fixed to the magnet unit 10b and the other end thereof is fixed to the fine-motion stage 8. The magnet unit 10b has a position sensor (not shown) to measure a relative position to the fine-motion stage 8 in the X, Y, and θ directions. The relative-position measuring means may be, for example, a sensor in which the gap sensor 18 of the first embodiment (see FIG. 2) is adapted for three-axis measurement.

In this embodiment, the number of control axes in the fine-motion cable unit 10' is three. A simplified unit that has a reduced number of control axes may be applicable. Since this simplified cable unit can move finely and follow fine motion, the present invention is more advantageous than known stage systems.

Third Embodiment

Figure 6:
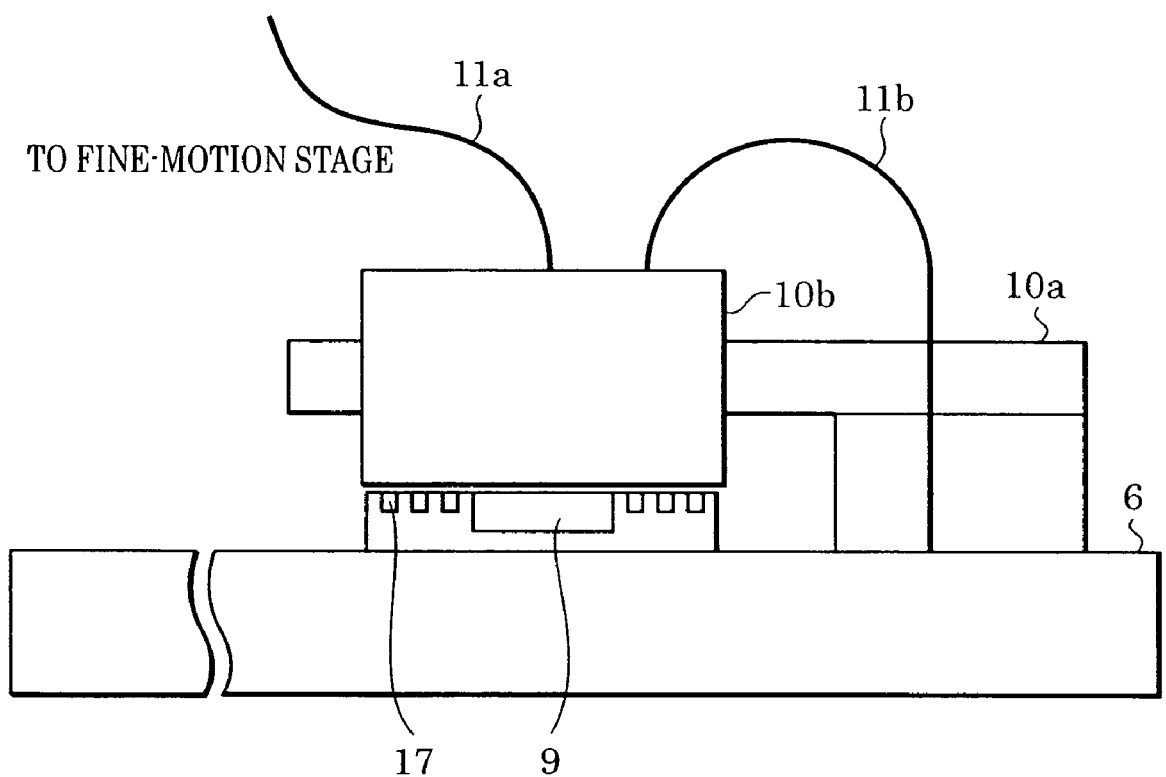
FIG. 6 shows a stage system according to a third embodiment.

FIG. 6 shows a third embodiment in which the stage system of the second embodiment is applied in a non-atmospheric environment, such as in a vacuum. A major difference in this embodiment is that an exhaust slot 17 is arranged around an air pad 9 supporting the magnet unit 10b of the fine-motion cable unit.

In FIG. 6, the same reference numerals have been retained for similar parts which have the same structures shown in FIG. 5C, and explanations thereof are omitted. In this embodiment, the exhaust slot 17 arranged around the air pad 9 is connected to an external pump with piping (not shown) therebetween. Gas emitted from the air pads 9 is retrieved by a pump (not shown) to prevent the gas from leaking to a vacuum atmosphere around the stage system.

Additionally, in order to avoid outgassing, a grease applicable to vacuum conditions may be used in the LM guides 5 (see FIG. 4) of the X stage 6, or surface treatment for vacuum conditions may be performed on stage components including the LM guides 5 and the cable 11.

In general, cables or pipes for vacuum conditions are thick and hard. This means that a cable or a pipe connected to the fine-motion stage 8 (see FIG. 4) is thick and hard, and therefore, even only small deformation of the cable or the pipe may readily transmit disturbance to the fine-motion stage 8. This embodiment is highly effective in such a case. The magnet unit 10b follows the fine-motion stage 8 with great accuracy so that the cable connected to the fine-motion stage 8 is substantially undeformed. Therefore, according to this embodiment, high-precision positioning control in the stage system used in a vacuum is achieved.

Fourth Embodiment

Figure 7:
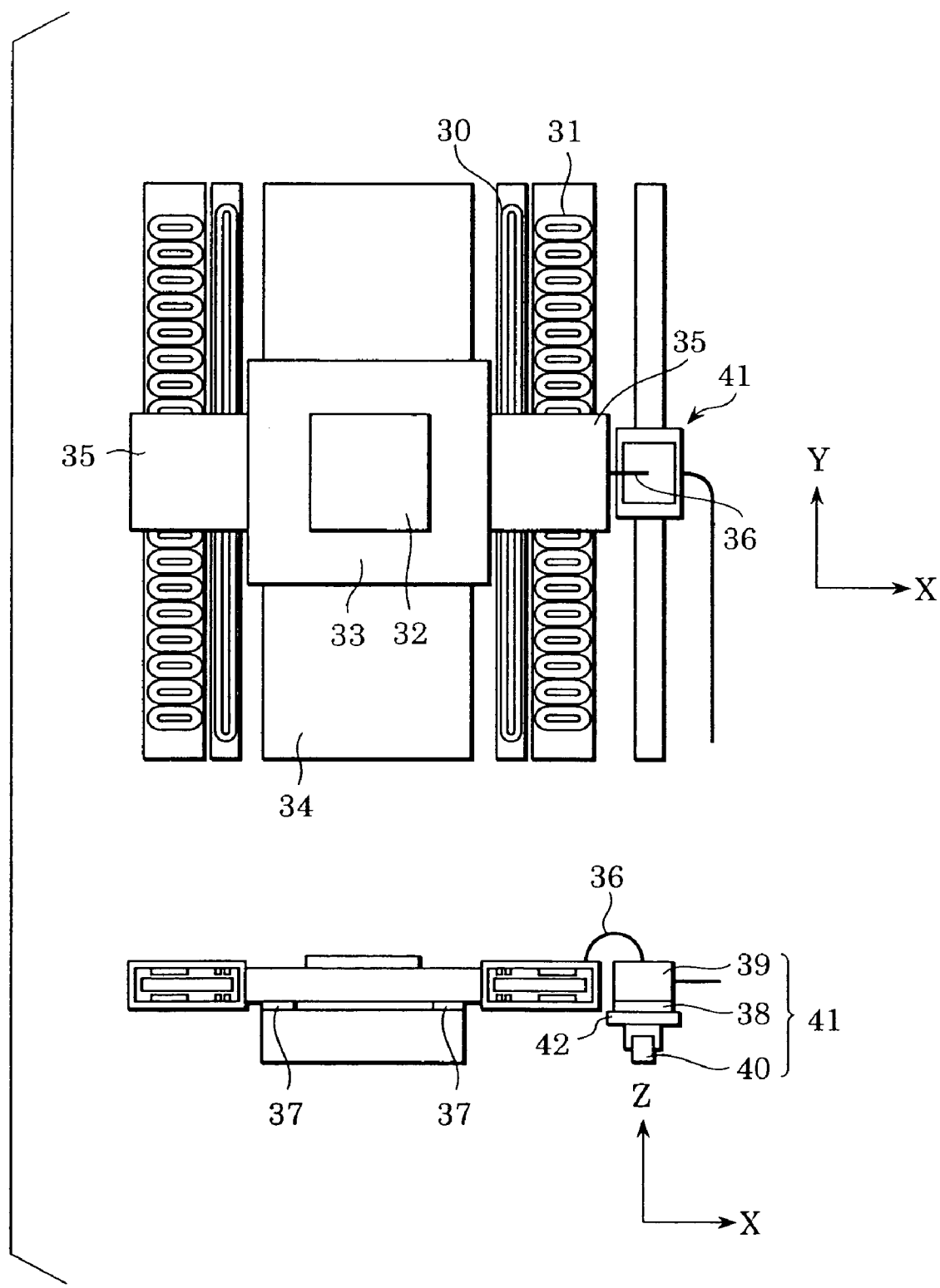
FIG. 7 shows a stage system according to a fourth embodiment.

FIG. 7 shows a fourth embodiment, in which the present invention is applied to a reticle stage of a scanning exposure apparatus.

A reticle stage 33, being a substrate stage, is supported on a reticle stage base table 34 with air pads 37 therebetween so as to be slidable in the X, Y, and θ directions. A reticle 32, being a master plate or a substrate (hereinafter, collectively called a substrate), is held on the reticle stage 33. Magnets 35 for moving a linear motor, and coils 30 and 31, being linear motor stators, are disposed on both sides of the reticle stage 33. The coils 30 and 31 are supported by supporters (not shown). Passing a current through the coils 31 drives the reticle stage 33 in the Y direction, and passing a current through the coils 30 drives the reticle stage 33 in the X direction. Changing the driving force on both sides of the reticle stage 33 drives the reticle stage 33 in the θ direction.

The position of the reticle stage 33 is measured by a laser interferometer (not shown) in the X, Y, and θ directions, so that position control is performed with great accuracy. The reticle stage 33 is equipped with a vacuum pipe 36 to provide a vacuum to the reticle 32. One end of the vacuum pipe 36 is fixed or attached to a cable controlling unit 41, and the vacuum pipe 36 is connected to a vacuum system of a subsequent stage through the cable controlling unit 41.

The cable controlling unit 41 includes: a contact LM guide 40; a following stage 42, being a coarse-motion cable unit or a coarse-motion cable stage, that holds a cable and moves in a long stroke; an air pad 38; and a fine-motion cable unit 39 supported on the following stage 42 with the air pad 38 therebetween. The following stage 42 is supported by the LM guide 40 so as to be movable in the Y direction. The following stage 42 is movable in a long stroke in the Y direction by a driving mechanism (not shown) so as to be synchronized with or substantially synchronized with the reticle stage 33 by means of a sensor (not shown).

A relative-position measuring instrument (sensor) (not shown) is provided to measure relative positions of the fine-motion cable unit 39 and the reticle stage 33 in the X, Y, and θ directions. The relative-position measuring instrument may be, for example, a sensor in which the gap sensor 18 of the first embodiment (see FIG. 2) is adapted for three-axis measurement, and the measuring target 19 shown in FIG. 2 is disposed on the linear-motor moving elements (magnets) 35.

In this embodiment, the following stage 42 and the fine-motion cable unit 39 are subjected to driving control by measuring relative positions to their following targets to keep the relative positions constant. However, the following stage 42 and the fine-motion cable unit 39 may be subjected to position control performed by measuring absolute positions with, for example, a laser interferometer.

The fine-motion cable unit 39 has the same structure as that of the second embodiment, and therefore, explanation thereof is omitted.

In this embodiment, the following stage 42 of the cable controlling unit 41 follows the reticle stage 33 in the Y direction while being synchronized with or substantially synchronized with coarse motion of the reticle stage 33 in the Y direction, and the fine-motion cable unit 39 of the cable controlling unit 41 follows fine motion of the reticle stage 33 in the X, Y, and θ directions, with great accuracy.

As a result, disturbances resulting from the cable are not substantially transmitted to the reticle stage 33, thus achieving high-precision positioning control.

In this embodiment, the fine-motion cable unit 39 follows the fine-motion stage 8 or the reticle stage 33 with high accuracy so that disturbances caused by deformation of the cable are not transmitted to the fine-motion stage 8 or the reticle stage 33. It is essential only that disturbances be not transmitted to an object to be controlled with great accuracy. Instead of position measurement, detecting force and/or distortion caused by deformation of the cable and adjusting a magnet unit of a cable stage to eliminate the detected results may be used.

Application to an Exposure Apparatus

Figure 8:
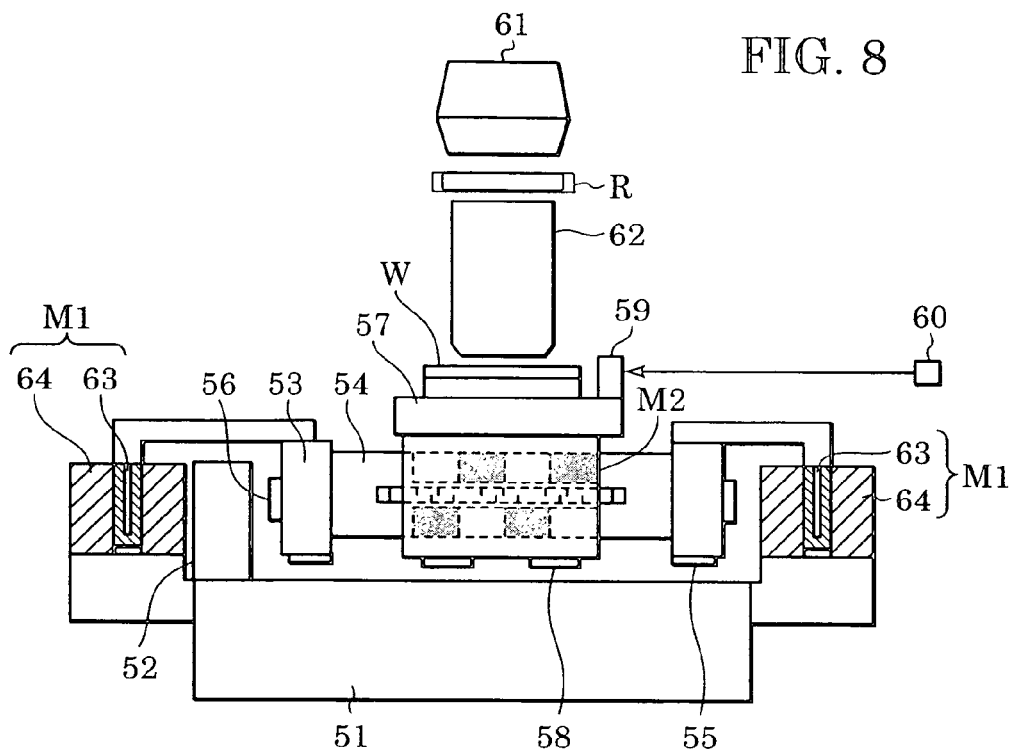
FIG. 8 shows an exposure apparatus.

FIG. 8 shows an exposure apparatus in which the stage system described above functions as a wafer stage for manufacturing a semiconductor device.

This exposure apparatus is used to manufacture a semiconductor device, such as a semiconductor integrated circuit, or a device in which a super-minute pattern is formed, such as a micromachine, or a thin-film magnetic head. A semiconductor wafer W, being a substrate, is irradiated with exposure light (this term is a generic name for visible radiation, ultraviolet radiation, extreme-ultraviolet (EUV) radiation, X-ray radiation, electron beams, charged-particle beams, and the like), being exposure energy, from a light source 61 through a reticle R, being a master plate, and a projection lens 62 (this term is a generic name for a refractor, a reflection lens, a reflection and refraction lens system, a charged-particle lens, and the like), being a projection system, to form a desired pattern on the substrate.

In this exposure apparatus, a guide 52 and linear motor stators 64 are fixed to a base table 51. Similar to the foregoing, the linear motor stators 64 have polyphase electromagnetic coils, and linear-motor moving elements 63 have permanent magnet groups. The moving parts 53, including the linear-motor moving elements 63, are connected to moving guides 54, being a stage, and move the moving guides 54 in a direction perpendicular to FIG. 8 by driving of linear motors M1. The moving parts 53 are supported by static pressure bearings 55 with respect to a top face of the base table 51 and by a static pressure bearing 56 with respect to a side of the guide 52.

A movement stage 57 lying across the moving guides 54 is supported by static pressure bearings 58. The movement stage 57 is driven by a linear motor M2, as with the foregoing, to move in horizontal directions in FIG. 8, with respect to the moving guides 54. The movement of the movement stage 57 is measured by a mirror 59, fixed on the movement stage 57, and an interferometer 60.

The wafer W, being a substrate, is held on a chuck disposed on the movement stage 57, and each reduced pattern of the reticle R, being a master plate, is transferred to each area of the wafer W by a step-and-repeat or a step-and-scan process.

The linear motor of the present invention is applicable to an exposure apparatus in which circuit patterns are drawn directly, without using a mask, and a resist is exposed.

Example of Method of Manufacturing a Device

Figure 9:
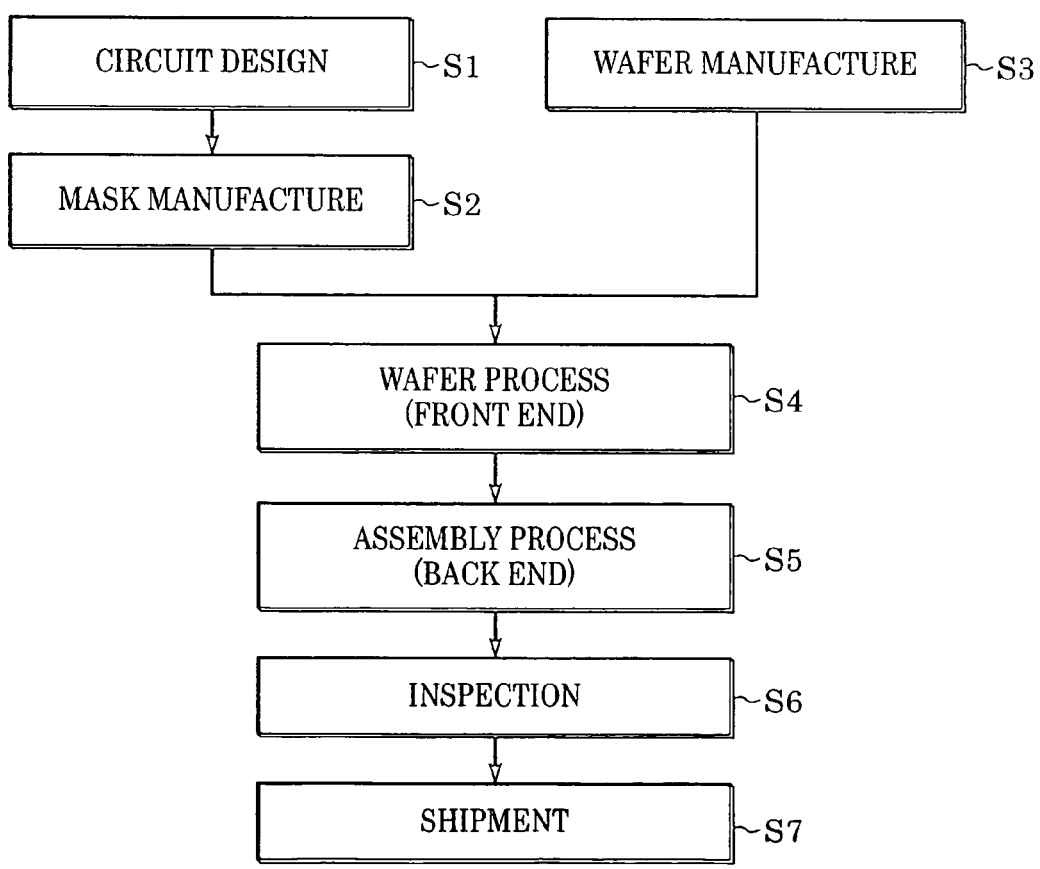
FIG. 9 is a flow chart of a process of manufacturing a semiconductor device.

A method of manufacturing a semiconductor device by using an exposure apparatus, such as described above, will now be described. FIG. 9 is a flow chart of the overall manufacturing process of the semiconductor device. In step S1 (circuit design), circuits of the semiconductor device are designed. In step S2 (mask manufacture), a mask is produced on the basis of the designed circuit patterns.

In step S3 (wafer manufacture), a wafer is prepared from a material such as silicon. In step S4 (wafer process), which is called a front end or a pre-process, circuits are practically formed on the wafer by lithography through the mask by using the above exposure apparatus. In step S5 (assembly process), which is called back end or post-process, the wafer produced by step S4 is constructed in chip form. This step includes an assembling process (dicing and bonding) and a packaging process (chip sealing). In step S6 (inspection), the semiconductor devices prepared by step S5 are subjected to an operation check, a durability check, and the like. After these steps, the completed semiconductor devices are shipped (step S7).

Figure 10:
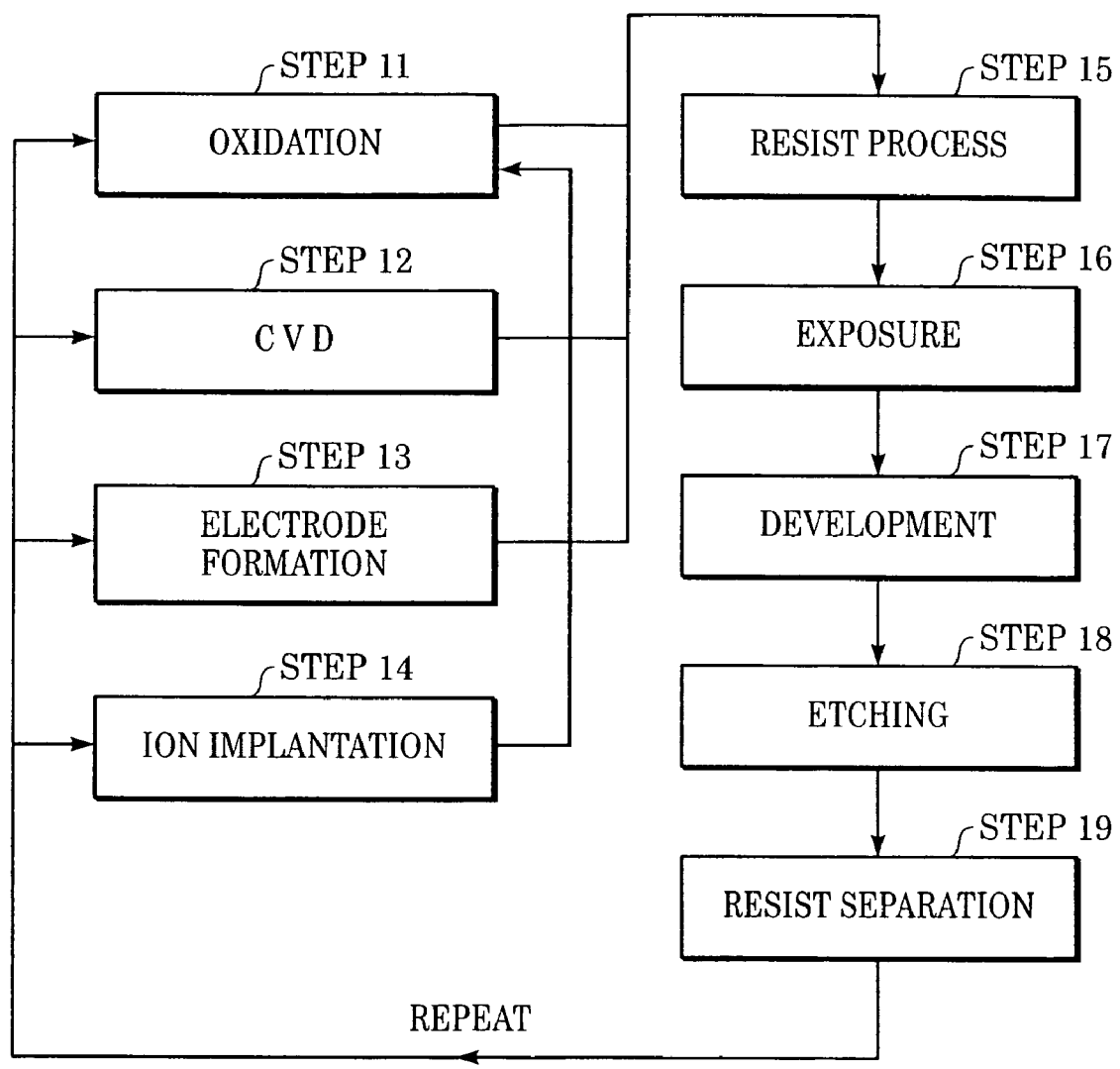
FIG. 10 is a flow chart of a wafer process.
Figure 11:
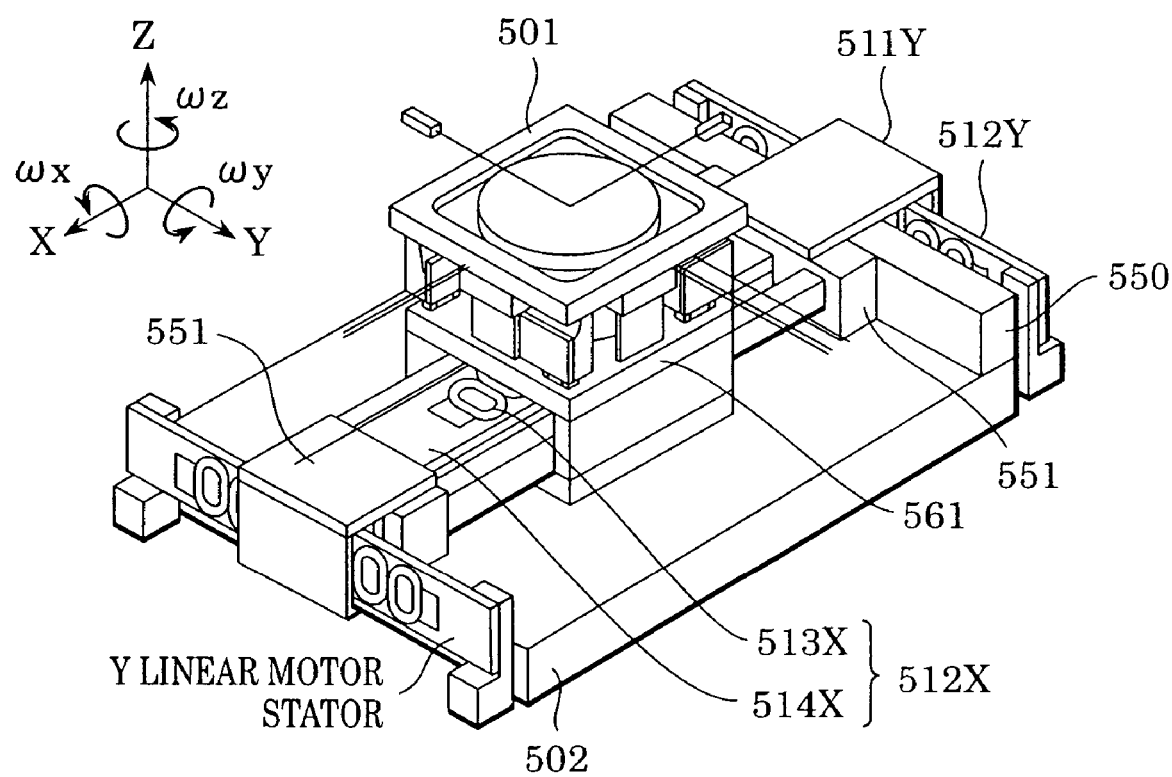
FIG. 11 shows a known stage system.

The above wafer process (step S4) includes the following steps (FIG. 10): an oxidation step (step 11) for oxidizing a surface of the wafer; a chemical-vapor-deposition (CVD) step (step 12) for forming an insulating film on the wafer surface; an electrode formation step (step 13) for forming electrodes on the wafer by vapor deposition; an ion implantation step (step 14) for implanting ions in the wafer; a resist process step (step 15) for applying a photoresist to the wafer; an exposure step (step 16) for transferring circuit patterns to the applied wafer by using the above exposure apparatus; a development step (step 17) for developing the exposed wafer; an etching step (step 18) for removing sections other than developed resist images; and a resist separation step (step 19) for separating remaining resist portions that become unnecessary after the etching step. These steps are repeated, thus forming multilayered circuit patterns on the wafer.

Except as otherwise discussed herein, the various components shown in outline or in block form in the Figures are individually well known and their internal construction and operation are not critical either to the making or using or to a description of the best mode of the invention.

While the present invention has been described with reference to what are at present considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A stage apparatus comprising:
    a first stage movable along a plane;
    a second stage, movable in at least two axial directions with respect to the first stage, on the first stage;
    a cable holding unit, movable in at least two axial directions with respect to the first stage, on the first stage, the cable holding unit being configured to hold a cable connected to the second stage;
    a sensor configured to measure relative positions of the first stage and the cable holding unit; and
    a drive configured to drive the cable holding unit on the basis of an output of the sensor,
    wherein the cable holding unit follows the second stage based on the output of the sensor.

2. The stage apparatus according to claim 1, wherein the second stage is not in contact with the first stage.

3. The stage apparatus according to claim 1, wherein the first stage is movable in at least two axial directions.

4. The stage apparatus according to claim 1, wherein the cable holding unit is not in contact with the first stage.

5. An exposure apparatus comprising:
    a stage apparatus configured to move a substrate, the apparatus including:
        (i) a first stage movable along a plane;
        (ii) a second stage, movable in at least two axial directions with respect to the first stage, on the first stage;
        (iii) a cable holding unit, movable in at least two axial directions with respect to the first stage, on the first stage, the cable holding unit being configured to hold a cable connected to the second stage;
        (iv) a sensor configured to measure relative positions of the first stage and the cable holding unit; and
        (v) a drive configured to drive the cable holding unit on the basis of an output of the sensor,
    wherein the cable holding unit follows the second stage.

* * * * *

UNITED STATES PATENT AND TRADEMARK OFFICE
CERTIFICATE OF CORRECTION

PATENT NO. : 7,280,185 B2  Page 1 of 1
APPLICATION NO. : 11/407152
DATED : October 9, 2007
INVENTOR(S) : Nobushige Korenaga It is certified that error appears in the above-identified patent and that said Letters Patent is hereby corrected as shown below:

COLUMN 5:
Line 4, "11$b$is" should read -- 11$b$ is --.

Signed and Sealed this

Thirteenth Day of May, 2008

JON W. DUDAS
*Director of the United States Patent and Trademark Office*